(12) United States Patent
Kido et al.

(10) Patent No.: US 6,423,429 B2
(45) Date of Patent: *Jul. 23, 2002

(54) ORGANIC ELECTROLUMINESCENT DEVICES

(75) Inventors: Junji Kido, 9-4-3, Umamikita Kouryou-cho, Kitakatsuragi-gun, Nara-ken; Tokio Mizukami; Jun Endoh, both of Kanagawa-ken, all of (JP)

(73) Assignees: Junji Kido, Nara-ken; International Manufacturing and Engineering Services Co., Ltd, Kanagawa-ken, both of (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/257,778

(22) Filed: Feb. 25, 1999

(30) Foreign Application Priority Data

Mar. 2, 1998 (JP) ............................................ 10-049771

(51) Int. Cl.$^7$ ................................................ H05B 33/14
(52) U.S. Cl. ..................... 428/690; 313/502; 313/506
(58) Field of Search ............................. 428/690, 917; 313/502, 503, 504, 506

(56) References Cited

U.S. PATENT DOCUMENTS

| | | | | |
|---|---|---|---|---|
| 5,247,190 A | | 9/1993 | Friend et al. | 257/40 |
| 5,281,489 A | * | 1/1994 | Mori et al. | 428/690 |
| 5,405,709 A | * | 4/1995 | Littman et al. | 428/690 |
| 5,512,400 A | * | 4/1996 | Takesue et al. | 430/78 |

(List continued on next page.)

FOREIGN PATENT DOCUMENTS

| | | | |
|---|---|---|---|
| EP | 373582 | 3/1995 | ........... H05B/33/14 |
| EP | 388768 | 8/1995 | ........... H05B/33/14 |
| JP | 59-194393 | 11/1984 | ........... H05B/33/14 |
| JP | 63-295695 | 12/1988 | ........... C09K/11/06 |
| JP | 2-88689 | 3/1990 | ........... C09K/11/06 |
| JP | 2-191694 | 7/1990 | ........... C09K/11/00 |
| JP | 2-196885 | 8/1990 | ........... C09K/11/06 |
| JP | 2-250292 | 10/1990 | ........... H05B/33/14 |

(List continued on next page.)

OTHER PUBLICATIONS

Patridge, R. H.: "Electroluminescence from polyvinylcarbazole films: 1. Carbazole cations", Polymer, June 1983, vol. 24, pp. 733–738.

Kido, J. et al.: "29.1: Invited Paper: Bright Organic EL Devices Having Metal–Doped Electron–Injecting Layer", SID International Symposium Digest of Technical Papers, SID, vol. 28, 1997 pp. 775–777.

Organic EL Devices Doped With a Quinacridone Derivative Showing Higher Brightness and Luminescent Efficiency, Pioneer Electronic Corp.

(List continued on next page.)

*Primary Examiner*—Cynthia H. Kelly
*Assistant Examiner*—Dawn Garrett
(74) *Attorney, Agent, or Firm*—McCormick, Paulding & Huber LLP

(57) ABSTRACT

An organic electroluminescent device includes at least one light emission layer from an organic compound, the light emission layer being positioned between an anode electrode and a cathode electrode opposed to the anode electrode, in which an organic layer positioned adjacent to the anode electrode is from an organic compound which includes, as an electron-accepting dopant, an electron-accepting compound having a property of oxidizing the organic compound of said organic layer, said electron-accepting compound being doped to said organic layer in vacuum with a simultaneous evaporation method.

6 Claims, 3 Drawing Sheets

U.S. PATENT DOCUMENTS

| | | | | |
|---|---|---|---|---|
| 5,540,999 | A | * 7/1996 | Yamamoto et al. | 428/411.1 |
| 5,719,467 | A | 2/1998 | Antoniadis et al. | 313/506 |
| 5,800,956 | A | * 9/1998 | Minemura et al. | 430/60 |
| 5,834,894 | A | * 11/1998 | Shirasaki et al. | 313/509 |
| 6,013,384 | A | * 1/2000 | Kido et al. | 428/690 |

FOREIGN PATENT DOCUMENTS

| | | | |
|---|---|---|---|
| JP | 2-252793 | 10/1990 | C09K/11/06 |
| JP | 2-255789 | 10/1990 | C09K/11/06 |
| JP | 2-289676 | 11/1990 | C09K/11/06 |
| JP | 3-231970 | 10/1991 | C09B/23/00 |
| JP | 3-296595 | 12/1991 | C09K/11/06 |
| JP | 4-96990 | 3/1992 | C09K/11/06 |
| JP | 5-9470 | 1/1993 | C09K/11/06 |
| JP | 5-17764 | 1/1993 | C09K/11/06 |
| JP | 5-202011 | 8/1993 | C07D/271/10 |
| JP | 05 331458 | 12/1993 | |
| JP | 6-25659 | 2/1994 | C09K/11/06 |
| JP | 6-49079 | 2/1994 | C07F/7/10 |
| JP | 6-88072 | 3/1994 | C09K/11/06 |
| JP | 6-92947 | 4/1994 | C07D/271/10 |
| JP | 6-100857 | 4/1994 | C09K/11/06 |
| JP | 6-107648 | 5/1994 | C07D/271/10 |
| JP | 6-132080 | 5/1994 | H05B/33/14 |
| JP | 6-145146 | 5/1994 | C07D/215/30 |
| JP | 6-203963 | 7/1994 | H05B/33/22 |
| JP | 6-206865 | 7/1994 | C07D/209/86 |
| JP | 6-207170 | 7/1994 | C09K/11/06 |
| JP | 6-215874 | 8/1994 | H05B/33/22 |
| JP | 6-279323 | 10/1994 | C07C/13/547 |
| JP | 6-293778 | 10/1994 | C07F/7/10 |
| JP | 7-97355 | 4/1995 | C07C/211/54 |
| JP | 7-101911 | 4/1995 | C07C/211/61 |
| JP | 7-126225 | 5/1995 | C07C/211/54 |
| JP | 7-126226 | 5/1995 | C07C/211/54 |
| JP | 7-145116 | 6/1995 | C07C/211/54 |
| JP | 7-157473 | 6/1995 | C07D/251/24 |
| JP | 7-179394 | 7/1995 | C07C/63/72 |
| JP | 7-188130 | 7/1995 | C07C/211/54 |
| JP | 7-224012 | 8/1995 | C07C/211/61 |
| JP | 7-228579 | 8/1995 | C07D/271/10 |
| JP | 7-278124 | 10/1995 | C07D/271/10 |
| JP | 8-22557 | 1/1996 | G06T/15/00 |
| JP | 8-40995 | 2/1996 | C07C/211/54 |
| JP | 8-40996 | 2/1996 | C07C/211/54 |
| JP | 8-40997 | 2/1996 | C07C/211/54 |
| JP | 8-48656 | 2/1996 | C07C/211/54 |
| JP | 8-81472 | 3/1996 | C07F/3/00 |
| JP | 10 050480 | 2/1998 | |

OTHER PUBLICATIONS

High Bright Organic Thin Film EL Devices Using a Li Alloy Cathode, Topan Printing Co. Ltd.

A Calcium Oxide Can be Reduced by Aluminum, Chemical Handbook, p. 369.

Metal Handbook p. 88.

Metal Handbook p. 87.

Polymer Light–Emitting Electrochemical Cells, Pei et al., Science, vol. 269, Aug. 25, 1995.

Physical Review Letters( vol. 14, No. 7), Feb. 15, 1965, pp. 228 and 230.

IEEE Transactions on Electron Diodes (vol. 40, No. 7), pp. 1342–1344.

Organic Electroluminescent Diodes, C.W. Tang and S.A. VanSlyke, App. Phys. Letters Sep. 21, 1997.

Society for Information Display International Symposium Digest of Technical Papers (vol. XXVIII) May 13–18, 1997. pp. 775–777.

Organic EL Cells Using Alkaline Metal Compounds as Electron Injection Materials, Wakimoto et al. pp. 1245–1247, Aug. 1997, IEE Transactions on Electron Devices.

Electroluminescence from Polyvinylcarbazole Films, R. H. Partridge, Polymer, 1983, vol. 24, pp. 733–738.

* cited by examiner

ORGANIC ELECTROLUMINESCENT DEVICES

BACKGROUND OF THE INVENTION

1. Field of the Invention

The present invention relates to an organic electroluminescent device or element (hereinafter, referred also to as an "organic EL device") which is utilized as a planar light source or utilized in display devices.

2. Description of the Related Art

Attention has been made to an organic EL device in which a luminescent layer, i.e., light emission layer is formed from a specific organic compound, because it ensures a large area display device which can be operated at a low voltage. To obtain a highly efficient EL device, Tang et al., as is reported in Appl. Phys. Lett., 51, 913 (1987), have succeeded in attaining an EL device having a structure in which organic compound layers having different carrier transporting properties are laminated to thereby introduce holes and electrons with a good balance from an anode, and a cathode. In addition, since the thickness of the organic compound layers is not more than about 2,000 Å, the EL device can exhibit a high luminance and efficiency sufficient for practical use; i.e., a luminance of about 1,000 cd/m$^2$ and an external quantum efficiency of about 1% at an applied voltage of not more than about 10 volts.

In this highly efficient EL device, Tang et al. have used magnesium (Mg) having a low work function in combination with an organic compound which is essentially considered to be an electrically insulating material, in order to reduce an energy barrier which can cause a problem during injection of electrons from a metal-made electrode. However, since the magnesium is liable to be oxidized and is unstable, and also exhibits only a poor adhesion to a surface of the organic layers, magnesium was used after alloying. Alloying is carried out by vapor co-deposition or simultaneous vapor evaporation of magnesium and silver (Ag) which is relatively stable and exhibits good adhesion to a surface of the organic layers.

Further, in the EL device developed by Tang et al., an indium-tin-oxide (ITO) is coated as an anode electrode over a glass substrate. However, the use of the ITO anode electrode device in the Tang et al. to obtain good contact (near to ohmic contact) is considered to be made due to an unexpected and fortunate occurrence; namely, the ITO electrode is frequently used as a transparent anode electrode made of metal oxide in the hole injection of the organic compound to satisfy the requirement for the omission of light in the planar area, and the ITO electrode can exhibit a relatively large work function of a maximum of 5.0 eV.

Furthermore, in their EL device, Tang et al. have inserted a layer of copper phthalocyanine (hereinafter termed as 'CuPc') having a thickness of not more than 200 Å between the anode and the hole-transporting organic compound layer to further improve contact efficiency of the anode interface region, thereby achieving the operation of the device at a low voltage.

Similar effects have been also confirmed from the starburst type arylamine compounds, proposed by Shirota et al. of Osaka University, by the researchers of Pioneer Co., Ltd. Both the CuPc compounds and the starburst type arylamine compounds have characteristics that show a work function smaller than that of ITO, and a relatively high mobility of hole charge, and thus improving the stability of the EL devices during the continuous usage thereof, facilitating low-voltage consumption and an improved interfacial contact.

In addition to the above-described devices having the vacuum evaporated layers, there are also known EL devices having the layers formed from a coating solution of a film-forming polymeric material by a coating method such as spin coating. In such EL devices, the coating solution is prepared by previously dispersing an electron-accepting compound in a hole-transporting polymeric material. For example, Partridge, as is reported in POLYMER, Vol.24, June 1983, has confirmed that an ohmic current can be obtained if an antimony pentachloride (hereinafter, SbCl$_5$) as an electron-accepting compound is dispersed in dichroromethane solution of polyvinyl carbazole (hereinafter, PVK), whereas such ohmic current could not been realized with the sole use of PVK in the layer formation. In this layer formation, it is understood that SbCl$_5$ can act as a Lewis acid so that a carbazole pendant group of PVK is oxidized to produce radical cations. SbCl$_5$ used by Partridge in the layer formation is in a liquid state at a room temperature, and is a Lewis acid compound having a remarkably high reactivity so that fumes can be produced upon reaction with water in atmospheric air. However, contrary to this, if it is reacted with PVK in a glove chamber under an inert atmosphere, SbCl$_5$ can form a stable complex compound, thereby enabling to form a layer of the complex compound under relatively stable conditions of atmospheric air. Thus, the above layer formation method is considered to be a rational one if it is intended to form a hole injection layer from a side of the ITO electrode. However, in the recent organic EL devices, a highly increased efficiency of the device has been achieved largely relying upon the high purity layer formation process which is based on vacuum evaporation and does not cause cross-contamination. In this production of EL devices, assuming that the above-described method by Partridge is directly applied without any modification, some questions arise because stable driving of the EL devices can be adversely affected by any residues of the solvent used in the coating solution and any impurities in the layer-forming materials.

SUMMARY OF THE INVENTION

The present invention is directed to solve the above-described problems in the EL devices of the prior art. An object of the present invention is to reduce the energy barrier in the hole injection from a transparent ITO anode electrode to a hole-transporting organic layer, and to achieve low-voltage consumption regardless of the work function of the anode material.

To accomplish the above object, the inventors have researched extensively and have now discovered that in the hole injection from an anode electrode to an organic layer adjacent to the anode electrode, an injection barrier (and thus, the voltage) can be reduced if the organic layer is doped with a compound capable of acting as an electron-accepting dopant by a co-deposition or simultaneous evaporation method.

According to the present invention, there is provided an organic electroluminescent (EL) device including at least one light emission layer from an organic compound, the light emission layer being positioned between an anode electrode and a cathode electrode opposed to the anode electrode, in which an organic layer positioned adjacent to the anode electrode is from an organic compound and includes, as an electron-accepting dopant, an electron-accepting compound having a property of oxidizing the organic compound of said organic layer, said electron-accepting compound being doped to said organic layer in vacuum by a simultaneous evaporation method.

In the organic EL devices, the hole injection process from an anode to an organic layer which is basically constituted from an electrically insulating organic compound is intended to carry out oxidation of the organic compound on a surface region of the organic layer, i.e., formation of a radical cation state thereof (cf., Phys. Rev. Lett., 14, 229 (1965)). In the organic EL device, an electron-accepting dopant substance or compound which can act as an oxidizing agent for the organic compound is previously doped in an organic layer in contact with the anode electrode, and thus the energy barrier of the hole injection from the anode electrode can be lowered as a result of such provisional doping of the dopant compound in the organic layer. Since the molecules in the oxidized state (oxidized by the dopant), i.e., in the electron-donated state, are already included in the doped organic layer, a barrier of the hole injection energy is low in the EL device, and therefore a driving voltage of the device can be lowered in comparison with the EL devices of the prior art.

In practice, the electron-accepting dopant used in the formation of the organic layer in contact with the anode electrode may be either an inorganic compound or an organic compound, as long as they have an electron-accepting property and can oxidize an organic compound in the organic layer. Particularly, suitable electron-accepting dopant compounds in the form of an inorganic compound include a Lewis acid compound such as ferric chloride, aluminum chloride, gallium chloride, indium chloride, antimony pentachloride. Further, if an organic dopant compound is used, suitable dopant compounds have a property of oxidizing an organic compound used in the hole injection layer through Lewis acid chemistry, such as trinitrofluorenone. These dopant compounds may be used alone or in combination.

When the above-described dopant compounds are doped in the organic layer by the co-deposition method, the compounds having a relatively low saturated vapor pressure such as ferric chloride and indium chloride can be contained in a crucible, followed by depositing using a conventional resistance heating method. Alternatively, if the dopant compounds used have a high vapor pressure at an ordinary temperature and therefore the pressure in the vacuum deposition apparatus can not be maintained at a level below the predetermined degree of vacuum, the vapor pressure may be controlled by using an orifice (opening size)-controlling means such as a needle valve or mass flow controller or by using a susceptor or sample-supporting means having a separate temperature-controlling system to cool the dopant compounds.

A thickness of the produced doped organic layer is not restricted to the specific thickness range, however, it is generally preferred that the thickness is not less than 5 Å. In the organic layer, the organic compounds contained therein can be present in a state of radical cations in the absence of electric field, and therefore they can act as an internal charge. Namely, no specific requirement of the layer thickness is given to the organic layer, and therefore a layer thickness of the organic layer can be increased without causing an undesirable increase of the voltage of the device. Therefore, in the EL device, the organic layer can be also utilized as a means for remarkably diminishing the possibility of short-circuiting, if a distance between the opposed electrodes of the device has increased more than conventional EL devices. Accordingly, it becomes possible to increase a total thickness of the organic layer(s) between the electrodes to 2,000 Å or more.

In the doped organic layer, the concentration of the dopant compound is not restricted to a specific range; however, it is generally preferred that a molar ratio of the organic compound or molecule to the dopant compound or molecule (i.e., organic molecule : dopant molecule) is in the range of about 1:0.1 to about 1:10. The molar ratio of the dopant molecule of less than 0.1 will result in only a poor doping effect, because a concentration of the molecules oxidized with the dopant (hereinafter "oxidized molecules") is an excessively low level. Similarly, if the molar ratio of the dopant molecule is above 10 times, only a poor and reduced doping effect will be obtained, because the dopant concentration is remarkably increased beyond that of the organic molecule, thereby causing an excessive reduction of the concentration of the oxidized molecules in the organic layer.

The present disclosure relates to subject matter contained in Japanese Patent Application No.10-49771 (filed on Mar. 2, 1998) which is expressly incorporated herein by reference in its entirety.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

The present invention will be further described with reference to the preferred embodiments thereof.

Figure 1:
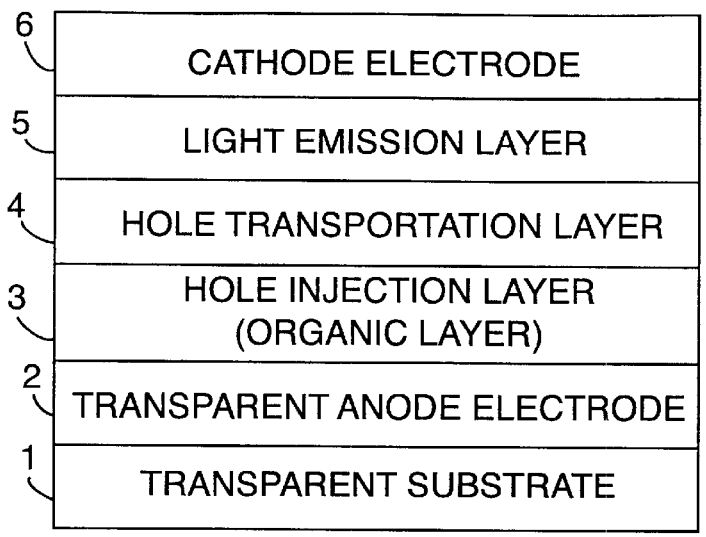
FIG. 1 is a cross-sectional view illustrating a lamination structure of the organic EL device according to an embodiment of the present invention.

FIG. 1 is a simplified cross-sectional view illustrating the organic EL device according to an embodiment of the present invention. In the illustrated EL device, a glass substrate (transparent substrate) 1 includes (laminated in the following order on a surface thereof): a transparent electrode 2 constituting an anode electrode, a hole injection layer (organic layer) 3 doped with an electron-accepting compound, a hole transportation layer 4 having hole-transporting properties, a luminescent or light emission layer 5, and a back electrode 6 constituting a cathode electrode. Among the above elements (layers) of the device, the glass substrate (transparent substrate) 1, the transparent electrode 2, the hole transportation layer 4, the light emission layer 5 and the back electrode 6 are the well-known elements. However, the hole injection layer 3 includes specific features of the present invention.

In addition to the illustrated lamination structure of the layers, the organic EL device of the present invention may include other lamination structures, for example: an anode, a hole injection layer, a hole transportation layer, a light emission layer, an electron transportation layer, and a cathode; an anode, a hole injection layer, a light emission layer, an electron injection layer, and a cathode; an anode, a hole injection layer, a hole transportation layer, a light emission layer, an electron transportation layer, an electron injection layer, and a cathode. The organic EL device may have any desired lamination structure, as long as a hole injection layer 3 doped with the electron-accepting compound is positioned in an interfacial region with the anode electrode 2.

In the production of the organic EL device, the organic compounds which can be used in the formation of the light emission layer and the electron transportation layer are not restricted to specific compounds. Typical examples of suitable organic compounds include polycyclic compounds such as p-terphenyl and quaterphenyl, as well as derivatives thereof; condensed polycyclic hydrocarbon compounds such as naphthalene, tetracene, pyrene, coronene, chrysene, anthracene, diphenylanthracene, naphthacene and phenanthrene, as well as derivatives thereof; condensed heterocyclic compounds such as phenanthroline, bathophenanthroline, phenanthridine, acridine, quinoline, quinoxaline and phenazine, as well as derivatives thereof; and fluoresceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone and rubrene, as well as derivatives thereof.

In addition to these organic compounds, metal-chelated complex compounds disclosed in Japanese Unexamined Patent Publication (Kokai) Nos. 63-295695, 8-22557, 8-81472, 5-9470 and 5-17764 can be suitably used as the organic compounds in the light emission layer and the electron transportation layer. Among these metal-chelated complex compounds, the metal-chelated oxanoide compounds, for example, metal complexes which contain (as a ligand thereof) at least one member selected from 8-quinolinolato as well as derivatives thereof, such as tris (8-quinolinolato) aluminum, bis (8-quinolinolato) magnesium, bis[benzo(f)-8-quinolinolato] zinc, bis (2-methyl-8-quinolinolato) aluminum, tri (8-quinolinolato) indium, tris (5-methyl-8-quinolinolato) aluminum, 8-quinolinolatolithium, tris (5-chloro-8-quinolinolato) gallium and bis (5-chloro-8-quinolinolato) calcium can be particularly suitably used.

It is also preferred that oxadiazoles disclosed in Japanese Patent Kokai Nos. 5-202011, 7-179394, 7-278124 and 7-228579, triazines disclosed in Japanese Patent Kokai No. 7-157473, stilbene derivatives and distyrylarylene derivatives disclosed in Japanese Patent Kokai No. 6-203963, styryl derivatives disclosed in Japanese Patent Kokai Nos. 6-132080 and 6-88072, and diolefin derivatives disclosed in Japanese Patent Kokai Nos.6-100857 and 6-207170 are used as the organic compounds in the formation of the light emission layer and the electron transportation layer.

Further, a fluorescent whitening agent such as benzoxazoles, benzothiazoles and benzoimidazoles may be used as the organic compounds, and it includes, for example, those disclosed in Japanese Patent Kokai No. 59-194393. Typical examples of the fluorescent whitening agent include the fluorescent whitening agents classified under the group of benzoxazoles such as 2,5-bis (5,7-di-t-pentyl-2-benzoxazolyl)-1,3,4-thiadiazole, 4,4'-bis (5,7-t-pentyl-2-benzoxazolyl)stilbene, 4,4'-bis[5,7-di(2-methyl-2-butyl)-2-benzoxazolyl]stilbene, 2,5-bis(5,7-di-t-pentyl-2-benzoxazolyl)thiophene, 2,5-bis[5-($\alpha$, $\alpha$-dimethylbenzyl)-2-benzoxazolyl]thiophene, 2,5-bis[5,7-di(2-methyl-2-butyl)-2-benzoxazolyl]-3,4-diphenylthiophene, 2,5-bis(5-methyl-2-benzoxazolyl)thiophene, 4,4'-bis(2-benzoxazolyl) biphenyl, 5-methyl-2- {2-[4-(5-methyl-2-benzoxazolyl) phenyl]vinyl} benzoxazole and 2-[2-(4-chlorophenyl)vinyl] naphtho(1,2-d)oxazole; under the group of benzothiazoles such as 2,2'-(p-phenylenedipynylene)-bisbenzothiazole; and under the group of benzoimidazoles such as 2-{2-[4-(2-benzoimidazolyl) phenyl]vinyl} benzoimidazole and 2-[2-(4-carboxyphenyl)vinyl]benzoimidazole.

As the distyrylbenzene compound, the compounds disclosed in European Patent No. 373,582 may be used. Typical examples of the distyrylbenzene compound include 1,4-bis (2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis (2-methylstyryl)-2-methylbenzene and 1,4-bis(2-methylstyryl)-2-ethylbenzene.

Furthermore, distyrylpyrazine derivatives disclosed in Japanese Patent Kokai No. 2-252793 may also be used as the organic compounds in the formation of the light emission layer and the electron transportation layer. Typical examples of the distyrylpyrazine derivatives include 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl) pyrazine, 2,5-bis[2-(4-biphenyl)vinyl]pyrazine and 2,5-bis [2-(1-pyrenyl)vinyl]pyrazine.

In addition, dimethylidine derivatives disclosed in European Patent No. 388,768 and Japanese Patent Kokai No. 3-231970 may also be used as the material of the light emission layer and the electron transportation layer. Typical examples of the dimethylidine derivatives include 1,4-phenylenedimethylidine, 4,4'-phenylenedimethylidine, 2,5-xylylenedimethylidine, 2,6-naphthylenedimethylidine, 1,4-biphenylenedimethylidine, 1,4-p-terephenylenedimethylidine, 9,10-anthracenediyldimethylidine, 4,4'-(2,2-di-t-butylphenylvinyl)biphenyl and 4,4'-(2,2-diphenylvinyl) biphenyl as well as derivatives thereof; silanamine derivatives disclosed in Japanese Patent Kokai Nos. 6-49079 and 6-293778; polyfunctional styryl compounds disclosed in Japanese Patent Kokai Nos. 6-279322 and 6-279323; oxadiazole derivatives disclosed in Japanese Patent Kokai Nos. 6-107648 and 6-92947; anthracene compounds disclosed in Japanese Patent Kokai No. 6-206865; oxynate derivatives disclosed in Japanese Patent Kokai No. 6-145146; tetraphenylbutadiene compounds disclosed in Japanese Patent Kokai No. 4-96990; and organic trifunctional compounds disclosed in Japanese Patent Kokai No. 3-296595; as well as coumarin derivatives disclosed in Japanese Patent Kokai No. 2-191694; perylene derivatives disclosed in Japanese Patent Kokai No. 2-196885; naphthalene derivatives disclosed in Japanese Patent Kokai No. 2-255789; phthaloperynone derivatives disclosed in Japanese Patent Kokai Nos. 2-289676 and 2-88689; and styrylamine derivatives disclosed in Japanese Patent Kokai No. 2-250292.

Moreover, any other well-known organic compounds which are conventional in the production of the organic EL devices may be suitably used.

The arylamine compounds used in the formation of the hole injection layer (doping layer), the hole transportation layer and the hole-transporting light emission layer, although they are not restricted to the following, preferably include those disclosed in Japanese Patent Kokai Nos. 6-25659, 6-203963, 6-215874, 7-145116, 7-224012, 7-157473, 8-48656, 7-126226, 7-188130, 8-40995, 8-40996, 8-40997, 7-126225, 7-101911 and 7-97355. Typical examples of suitable arylamine compounds include, for example, N,N,N',N'-tetraphenyl-4,4'-diaminophenyl, N,N'-diphenyl-N,N'-di(3-methylphenyl)-4,4'-diaminobiphenyl, 2,2-bis(4-di p-tolylaminophenyl)propane, N,N,N',N'-tetra-p-tolyl-4,4'-diaminobiphenyl, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostilbenzene, N-phenylcarbazole, 1,1-bis(4-di-p-triaminophenyl) cyclohexane, 1,1-bis(4-di-p-triaminophenyl)-4-phenylcyclohexane, bis(4-dimethylamino-2-methylphenyl) phenylmethane, N,N,N-tri(p-tolyl)amine, 4-(di-p-tolylamino)-4'-[4-(di-p-tolylamino)styryl]stilbene, N,N,N', N'-tetrapheny 1-4,4'-diaminobiphenyl N-phenylcarbazole, 4,4'-bis[N-(1-naphthyl)-N-phenylamino]biphenyl, 4,4"-bis [N-(1-naphthyl)-N-phenylamino] p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenyl, 4,4"-bis[N-(1-anthryl)-N-phenylamino] p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino) naphthalene, 2,6-bis[di-(1-naphthyl) amino]naphthalene, 2,6-bis[N-(1-naphthyl)-N-(2-naphthyl)amino]naphthalene, 4,4"-bis[N,N-di(2-naphthyl)amino]terphenyl, 4,4'-bis {N-phenyl-N-[4-(1-naphthyl)phenyl]amino} biphenyl, 4,4'-bis [N-phenyl-N-(2-pyrenyl)amino]biphenyl, 2,6-bis[N,N-di(2-naphthyl) amino]fluorene, 4,4"-bis(N,N-di-p-tolylamino)terphenyl and bis(N-1-naphthyl)(N-2-naphthyl) amine. Also, any other well-known arylamine compounds which are conventional in the production of the organic EL devices may be suitably used.

The cathode electrode used in the EL device of the present invention is not particularly restricted, as long as it is formed from a metal which can be stably used in air. Aluminum, which is generally and widely used as the wiring electrode, is preferably used as the anode material of the present device.

As can be appreciated from the above detailed descriptions and the appended working examples, since an organic compound layer doped with an electron-accepting compound is disposed in an interfacial region with the anode electrode, it becomes possible to provide an organic EL device capable of operating at a low voltage. Accordingly, the EL device of the present invention can show a high utility in practical use, and ensures their effective utilization as display devices, light sources and others.

EXAMPLES

The present invention will be further described with reference to the following examples; however, it should be noted that the present invention is not restricted by these examples.

In the following examples, a vapor deposition of the organic compound and that of the metal each was carried out by the vapor deposition apparatus "VPC-400" commercially available from Shinku Kikou Co.,Ltd. The thickness of the deposited layers was determined by the profilometer "DekTak3ST" commercially available from Sloan Co.,Ltd.

Further, the characteristics of the organic EL device were determined by the source meter "2400" commercially available from Keithley & Co. and the luminance meter "BM-8" commercially available from Topcon Co.,Ltd. A DC voltage was applied in steps at an increasing rate of one volt per 2 seconds to the EL device having an ITO anode and an aluminum (Al) cathode, and the luminance and the electric current were determined after one second had passed from the completion of each increase of the voltage. The EL spectrum was determined by the optical multichannel analyzer "PMA-10", commercially available from Hamamatsu Photonics Co., Ltd., driven at a constant electric current.

Example 1

The organic EL device having the lamination structure illustrated in FIG. 1 was produced according to the present invention.

A glass substrate 1 was coated with an ITO (indium-tin-oxide) layer having a sheet resistance of 25 Ω/□, commercially available as a sputtered product from Sanyo Shinku Co.,Ltd., to form a transparent anode electrode 2. Then, alpha (α)-NPD having a hole transporting property, represented by the following formula (1), and ferric chloride (FeCl$_3$) were co-depositioned at a molar ratio of 1:2 onto the ITO-coated glass substrate 1 under the pressure of $10^{-6}$ Torr and an evaporation rate of 3 Å/sec to form a hole injection layer 3 having a thickness of 100 Å.

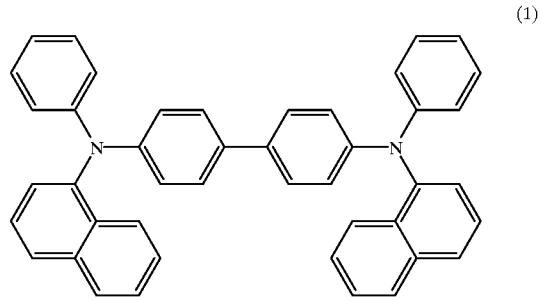

(1)

Under the same vacuum evaporation conditions, α-NPD was deposited onto the hole injection layer 3 to form a hole transportation layer 4 having a thickness of 500 Å.

Next, an aluminum complex of tris (8-quinolinolato) (hereinafter, referred to as "Alq") represented by the following formula (2) was deposited onto the hole transportation layer 4 under the same vacuum evaporation conditions as in the above-described deposition of the hole transportation layer 4 to form a light emission layer 5 having a thickness of 700 Å.

(2)

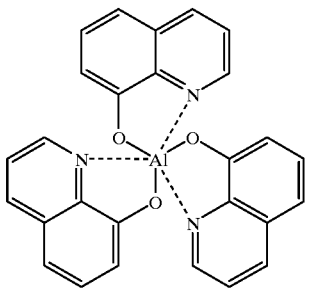

After the formation of the light emission layer 5, aluminum (Al) was deposited at the evaporation rate of 15 Å/sec onto the light emission layer 5 to form a back electrode 6, acting as a cathode, having a thickness of 1,000 Å. The organic EL device having a square luminescent area of 0.5 cm (length) by 0.5 cm (width) was thus obtained.

Figure 2:
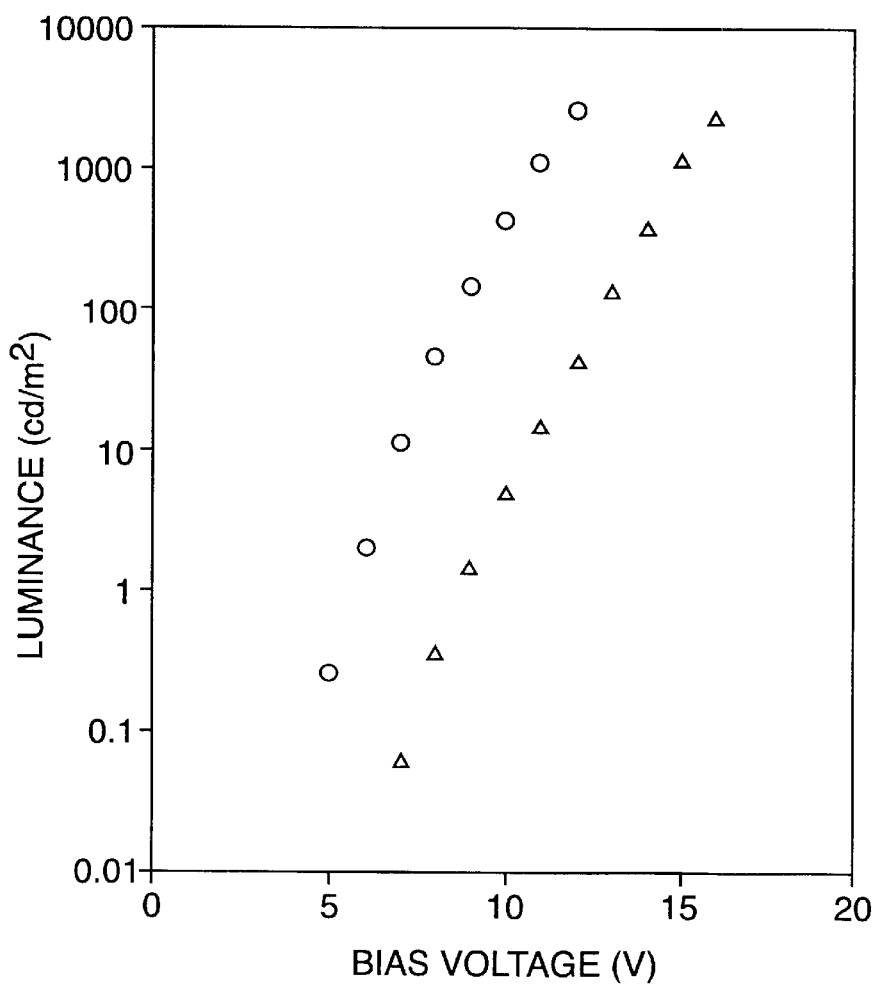
FIG. 2 is a graph showing the relationship between the bias voltage and the luminance for the organic EL device according the present invention, and a comparative organic EL device.
Figure 3:
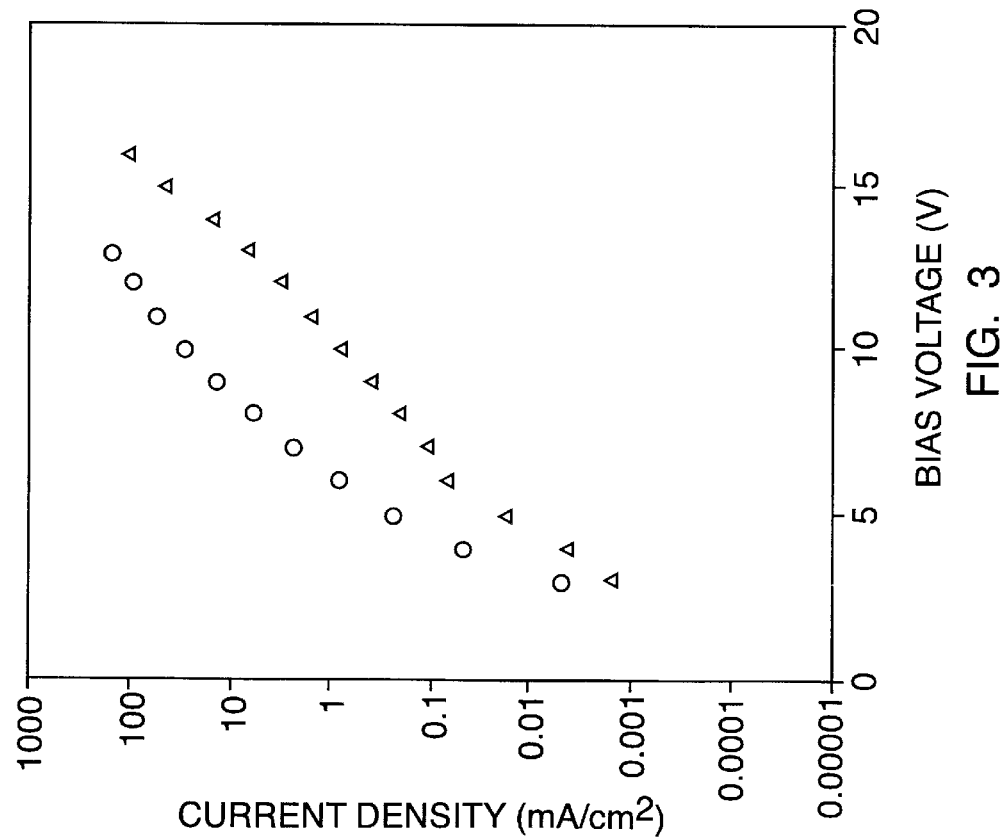
FIG. 3 is a graph showing the relationship between the bias voltage and the current density for the organic EL device according the present invention, and a comparative organic EL device.

In the thus produced organic EL device, a DC voltage was applied between the anode electrode (ITO) 2 and the cathode electrode (Al) 6, and a luminance of the green luminescence from the light emission layer (Alq) 5 was determined to obtain the results plotted with circles in FIG. 2 showing the relationship between the bias voltage and the luminance of the EL device, and in FIG. 3 showing the relationship between the bias voltage and the current density of the EL device. These results indicate that a luminance of at most 4,700 cd/M$^2$ could be obtained at the applied bias voltage of 12 volts. The current density was determined to be 650 mA/cm$^2$ at the same bias voltage. Further, it was determined that the light emission was started at the applied bias voltage of 3 volts.

Comparative Example 1

The procedure of Example 1 was repeated with the proviso that, for the purpose of comparison, a doped hole injection layer was omitted from the organic EL device. Namely, α-NPD was first deposited onto the ITO-coated glass substrate to form a hole transportation layer having a thickness of 500 Å, and then Alq was deposited under the same vacuum evaporation conditions as in the deposition of the hole transportation layer to form a light emission layer having a thickness of 700 Å. Thereafter, aluminum (Al) was deposited at a thickness of 1,000 Å over the light emission layer to form a cathode electrode.

In the produced organic EL device, the luminance was determined as in Example 1 to obtain the results plotted with triangular marks in each of FIG. 2 and FIG. 3. These results indicate that a luminance of at most 2,400 cd/m$^2$ could be obtained at the applied bias voltage of 16 volts. The current density was determined to be 110 mA/cm$^2$ at the same bias voltage, and the voltage required to start the light emission was 7 volts. It is appreciated from these results that the presence of the hole injection layer 3 which is essential to the organic EL device of the present invention is effective to reduce the driving voltage of the EL device.

Example 2

The procedure of Example 1 was repeated with the proviso that in this example, a thickness of the hole injection layer was increased to 4,000 Å.

Figure 4:
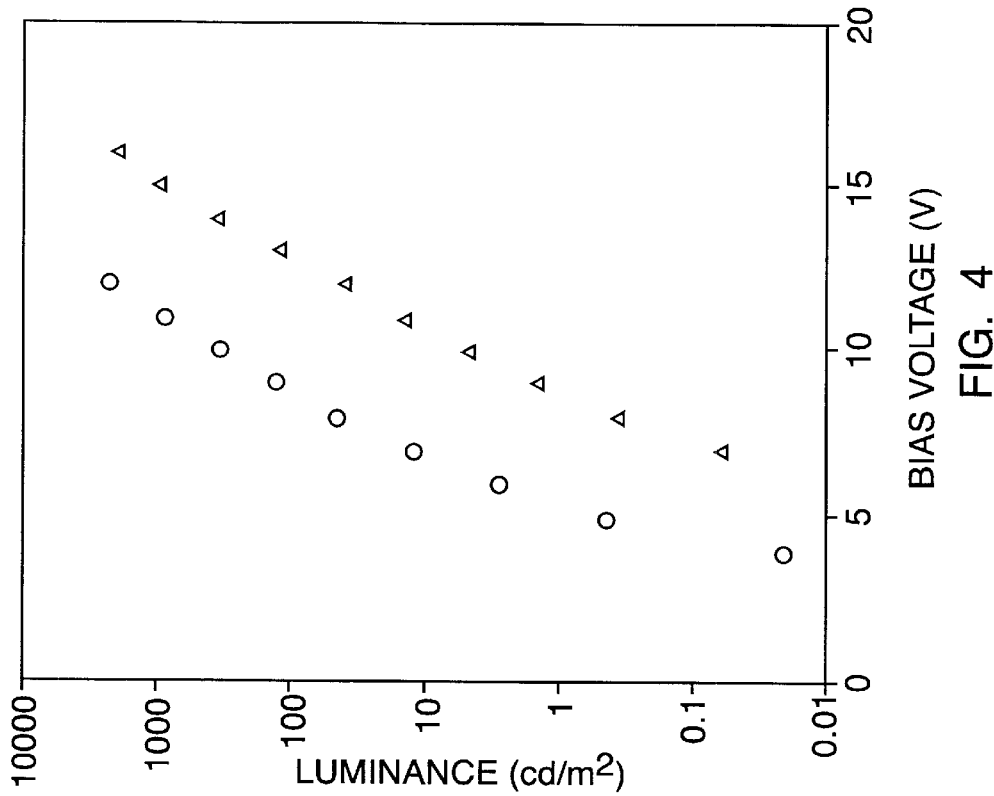
FIG. 4 is a graph showing the relationship between the bias voltage and the luminance for the organic EL device according the present invention, and a comparative organic EL device.
Figure 5:
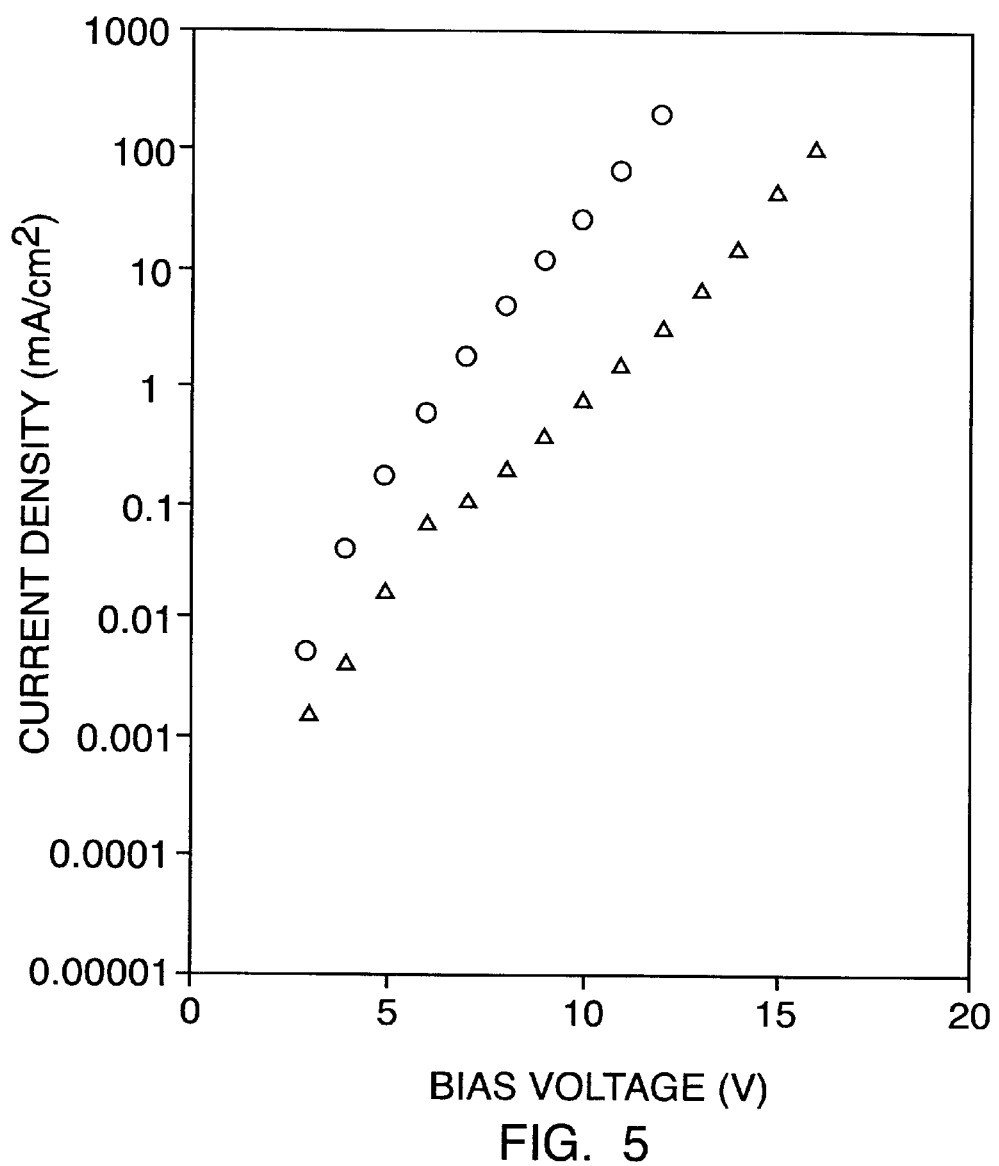
FIG. 5 is a graph showing the relationship between the bias voltage and the current density for the organic EL device according the present invention, and a comparative organic EL device.

In the produced organic EL device, the luminance was determined as in Example 1 to obtain the results plotted with circles in FIG. 4 showing the relationship between the bias voltage and the luminance of the EL device, and in FIG. 5 showing the relationship between the bias voltage and the current density of the EL device. These results indicate that a luminance of at most 4,500cd/m$^2$ could be obtained at the applied bias voltage of 12 volts which is the same as that of Example 1. The current density was determined to be 610 mA/cm$^2$ at the same bias voltage. Further, it was determined that the light emission was started at the applied bias voltage of 3 volts. Furthermore, the result obtained in the Comparative Example 1 is plotted with triangular marks in FIG. 4 and FIG. 5. It was found from these results, the results of Example 1 and the results of Comparative Example 1 that an increase of the thickness of the doped hole injection layer does not cause an increase of the driving voltage of the EL device.

Although the invention has been described with reference to particular means, materials and embodiment, it is to be understood that the invention is not limited to the particulars disclosed and extends to all equivalents within the scope of the claims.

What is claimed is:

1. An organic electroluminescent device comprising at least one light emission layer made from at least one organic compound, the light emission layer being positioned between an anode electrode and a cathode electrode opposed to the anode electrode, and a hole injection layer positioned adjacent to the anode electrode, said hole injection layer being made from at least one organic compound doped with a dopant, said dopant having a property of oxidizing the at least one organic compond of said hole injection layer through Lewis acid chemistry, by vacuum co-deposition of said dopant and said at least one organic compound of said hole injection layer.

2. The organic electroluminescent device according to claim 1, in which said dopant comprises an inorganic compound.

3. The organic electroluminescent device according to claim 1, in which said dopant comprises at least one Lewis acid compound selected from the group consisting of ferric chloride, aluminum chloride, gallium chloride, indium chloride and antimony pentachloride.

4. The organic electroluminescent device according to claim 1, in which said dopant comprises an organic compound.

5. The organic electroluminescent device according to claim 1, in which a molar ratio of the dopant to the at least one organic compound of said hole injection layer is in the range of 0.1 to 10.

6. The organic electroluminescent device according to claim 1, in which a total thickness of said hole injection layer is more than 2000 Å.

* * * * *